(12) United States Patent
Sutardja

(10) Patent No.: US 9,190,952 B1
(45) Date of Patent: *Nov. 17, 2015

(54) LOW-POWER VOLTAGE-CONTROLLED OSCILLATOR

(71) Applicant: Marvell International LTD., Hamilton (BM)

(72) Inventor: Sehat Sutardja, Los Altos Hills, CA (US)

(73) Assignee: Marvell International LTD., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 14/263,289

(22) Filed: Apr. 28, 2014

Related U.S. Application Data

(60) Continuation of application No. 13/443,147, filed on Apr. 10, 2012, now Pat. No. 8,710,937, which is a division of application No. 12/763,027, filed on Apr. 19, 2010, now Pat. No. 8,159,308.

(60) Provisional application No. 61/170,958, filed on Apr. 20, 2009.

(51) Int. Cl.
*H03B 5/12* (2006.01)
*H03L 5/00* (2006.01)

(52) U.S. Cl.
CPC ............ *H03B 5/1228* (2013.01); *H03B 5/129* (2013.01); *H03B 5/1212* (2013.01); *H03B 5/1278* (2013.01); *H03L 5/00* (2013.01); *H03B 2200/0062* (2013.01); *H03B 2201/031* (2013.01); *H03B 2201/038* (2013.01)

(58) Field of Classification Search
CPC .......... H03B 5/08; H03B 5/12; H03B 5/1206; H03B 5/1212; H03B 5/1215; H03B 5/1228; H03B 5/1231; H03B 5/1234; H03B 5/1278; H03B 5/129; H03B 2200/0062; H03B 2201/031; H03B 2201/038; H03B 2202/06; H03L 5/00; H03L 5/02
USPC .......... 331/15, 109, 117 FE, 117 R, 167, 182, 331/183, 185, 186
See application file for complete search history.

(56) References Cited

U.S. PATENT DOCUMENTS

| 4,053,849 | A | * | 10/1977 | Bower et al. ..................... 331/65 |
| 4,918,406 | A |   | 4/1990  | Baumbach et al. |
| 6,064,277 | A |   | 5/2000  | Gilbert |
| 6,150,893 | A | * | 11/2000 | Fattaruso .................. 331/117 R |

(Continued)

OTHER PUBLICATIONS

Andrea Mazzanti, "Class-C Harmonic CMOS VCOs, With a General Result on Phase Noise," IEEE Journal of Solid-State Circuits, vol. 43, No. 12, Dec. 2008.

(Continued)

*Primary Examiner* — Levi Gannon

(57) ABSTRACT

A circuit including a tank circuit, a pair of transistors, a bias circuit, and a capacitor. The transistors include (i) drain terminals coupled to the tank circuit, (ii) source terminals coupled to each other, and (iii) gate terminals cross-coupled to the drain terminals via a pair of capacitors. The bias circuit is coupled to the gates of the pair of transistors to i) alternatingly turn on the pair of transistors during a plurality of peaks of an oscillating signal of the tank circuit, and ii) turn off the pair of transistors during a plurality of crossing points of the oscillating signal. The capacitor is coupled to (i) the tank circuit and (ii) the pair of transistors.

17 Claims, 10 Drawing Sheets

(56) References Cited

U.S. PATENT DOCUMENTS

| | | | |
|---|---|---|---|
| 6,469,586 B1 * | 10/2002 | Rogers et al. | 331/117 R |
| 6,469,587 B2 | 10/2002 | Scoggins | |
| 6,653,908 B1 | 11/2003 | Jones | |
| 6,680,655 B2 | 1/2004 | Rogers | |
| 6,724,273 B1 * | 4/2004 | Jones | 331/177 V |
| 6,731,182 B2 | 5/2004 | Sakurai | |
| 6,750,726 B1 | 6/2004 | Hung et al. | |
| 6,765,448 B2 | 7/2004 | Wu et al. | |
| 6,781,471 B2 | 8/2004 | Huang | |
| 6,791,426 B2 * | 9/2004 | Sato | 331/117 R |
| 6,838,952 B2 | 1/2005 | Ramet | |
| 6,867,658 B1 * | 3/2005 | Sibrai et al. | 331/185 |
| 6,882,237 B2 | 4/2005 | Singh et al. | |
| 6,909,336 B1 * | 6/2005 | Rajagopalan et al. | 331/183 |
| 6,943,637 B2 | 9/2005 | Ruffieux | |
| 6,963,252 B2 | 11/2005 | Kasperkovitz | |
| 7,026,883 B2 | 4/2006 | Muthali et al. | |
| 7,057,469 B2 * | 6/2006 | Prentice | 331/117 R |
| 7,061,337 B2 | 6/2006 | Partovi et al. | |
| 7,196,592 B2 | 3/2007 | Shi et al. | |
| 7,327,201 B2 | 2/2008 | Miyashita et al. | |
| 7,675,374 B2 | 3/2010 | Min et al. | |
| 7,978,017 B2 | 7/2011 | Pernia et al. | |
| 8,031,020 B1 * | 10/2011 | Tu et al. | 331/117 FE |
| 8,076,982 B2 | 12/2011 | Suzuki | |
| 8,159,308 B1 | 4/2012 | Sutardja | |
| 2004/0092242 A1 * | 5/2004 | Endo | 455/264 |
| 2006/0097801 A1 * | 5/2006 | Adan | 331/46 |

OTHER PUBLICATIONS

U.S. Appl. No. 12/763,027, filed Apr. 19, 2010, entitled Low Power Voltage Controlled Oscillator (VCO).

* cited by examiner

LOW-POWER VOLTAGE-CONTROLLED OSCILLATOR

CROSS-REFERENCE TO RELATED APPLICATIONS

The present disclosure is a continuation of U.S. patent application Ser. No. 13/443,147 (now U.S. Pat. No. 8,710,937), filed on Apr. 10, 2012, which is a divisional of U.S. patent application Ser. No. 12/763,027 (now U.S. Pat. No. 8,159,308), filed Apr. 19, 2010, which claims the benefit of U.S. Provisional Application No. 61/170,958, filed on Apr. 20, 2009. The entire disclosures of the applications referenced above are incorporated herein by reference.

BACKGROUND

Particular embodiments generally relate to voltage controlled oscillators (VCOs).

Unless otherwise indicated herein, the approaches described in this section are not prior art to the claims in this application and are not admitted to be prior art by inclusion in this section.

FIG. 1 depicts a conventional voltage controlled oscillator 100. An inductor/capacitor tank (LC tank) 101 is formed by a parallel or series connection of an inductor 102 and a capacitor 104. LC-tank 101 is coupled to an active circuit, which is represented as a cross-coupled transistor pair 106. As shown, cross-coupled transistor pair 106 is coupled in parallel to LC-tank 101 and includes a first transistor 108a (MI) and a second transistor 108b (M2).

In operation, for a resonant frequency, the impedance of LC-tank 100 becomes infinite and when energy is stored initially in the tank, it circulates from voltage energy in capacitor 104 to current energy in inductor 102, and vice versa. This exchange of energy occurs at the resonant frequency, with the voltage and current being sinusoidal in quadrature phase with respect to each other and the ratio of the voltage and current amplitude being:

$$V/I = \sqrt{L/C}.$$

Reactive components, such as inductor 102 and capacitor 104, have losses in the real world implementation. The losses may be modeled as series or parallel resistances to LC-tank 100. The losses may dampen the oscillating signal generated by LC-tank 100. The active circuit may be used to compensate for the losses.

A negative resistance is synthesized by cross coupled transistor pair 106 and is explained by describing the currents sourced/sinked by cross-coupled transistor pair 106 to/away-from LC-tank 101. The current sourced/sinked is biased by a current source (Ibias) 110. When a voltage at a node Vp is at its positive peak value, the resistance of LC-tank 101 is taking away current from node Vp. To compensate for this, transistor 108a is sourcing current into node Vp. When the voltage at node Vp is at its negative peak value, the resistance of LC-tank 101 is sourcing current into node Vp and transistor 108a is sinking current from node Vp. The dual behavior happens at node Vn.

Cross-coupled transistor pair 106 is behaving as a negative resistance because cross-coupled transistor pair 106 is sourcing current from nodes Vp or Vn when the voltage is at a maximum at the nodes and sinking current from nodes Vp or Vn when the voltage is at a minimum at the nodes. The ratio between the voltage at nodes Vp or Vn to the current flowing out of nodes Vp or Vn is negative. Synthesizing the negative resistance sustains the oscillation at a desired frequency.

VCO 100 may be used in a radio frequency (RF) transceiver. VCO 100 offers advantages in that it is simple and offers relatively good performance. However, in some more advanced RF applications, voltage controlled oscillators with a better phase noise (higher purity) may be required. Typically, VCO 100 may be run with a higher current or through the use of an external inductor with a higher quality factor (Q).

The above solutions may reduce phase noise, but still inject current (energy) alternatingly to one side of VCO 100 to replenish the energy loss of LC-tank 101. The current energy injected into LC-tank 101 alternates essentially around the time when the oscillating signal changes polarity or crosses a middle point. Injecting current causes transistors 108a and 108b to alternatingly be on during the zero crossing point of the oscillating signal. While this will maintain the oscillation

SUMMARY

In one embodiment, an apparatus includes a tank circuit of a voltage controlled oscillator. A pair of transistors where each transistor of the pair of transistors has a gate, drain, and a source is included. The drain of each transistor of the pair of transistors is coupled to the tank circuit. The apparatus further includes a pair of alternating current (AC) coupling capacitors. The pair of AC coupling capacitors respectively couple the gates of the pair of transistors to the drains of the pair of transistors. A bias circuit is coupled to the gates of the pair of transistors. The bias circuit biases the pair of transistors in accordance with a bias voltage such that i) the pair of transistors alternatingly turn on during a plurality of peaks of an oscillating signal of the tank circuit, and ii) the pair of transistors turn off during a plurality of crossing points of the oscillating signal. A feedback loop is configured to i) detect a peak oscillating amplitude of the oscillating signal, and ii) adjust the bias voltage of the bias circuit based on the peak oscillating amplitude.

In one embodiment, a method is provided comprising: generating an oscillating signal using a tank circuit of a voltage controlled oscillator; alternatingly turning on a pair of transistors during a plurality of peaks of the oscillating signal of the tank circuit, wherein the pair of transistors are biased in accordance with a bias voltage to alternatingly turn on during the plurality of peaks of the oscillating signal; turning off the pair of transistors during a plurality of crossing points of the oscillating signal, wherein the pair of transistors are biased in accordance with the bias voltage to turn off during the plurality of crossing points of the oscillating signal; detecting a peak oscillating amplitude of the oscillating signal; and adjusting the bias voltage of the pair of transistors based on the peak oscillating amplitude.

The following detailed description and accompanying drawings provide a better understanding of the nature and advantages of the present invention.

DESCRIPTION

Described herein are techniques for a voltage controlled oscillator (VCO). In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein. For example, see FIG. 11.

Figure 1:
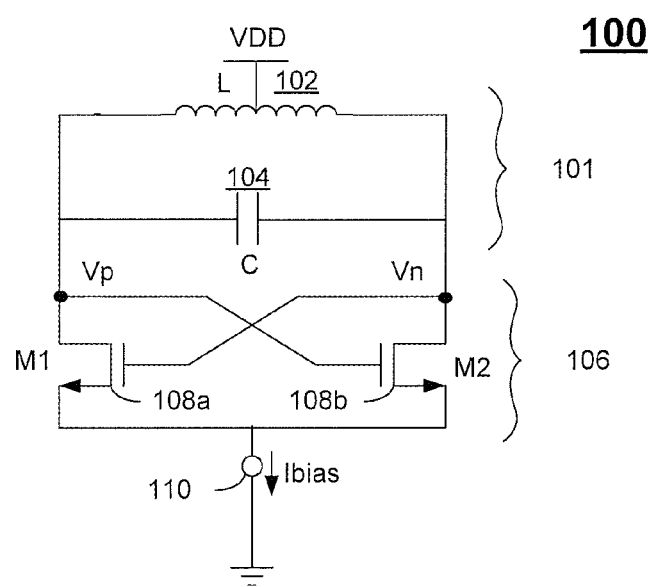
FIG. 1 depicts a conventional voltage controlled oscillator.
Figure 2:
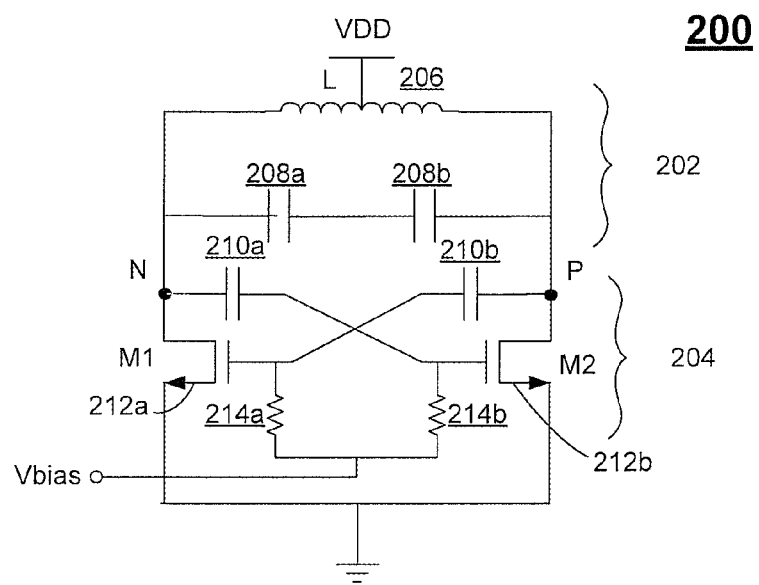
FIG. 2 depicts an example of a voltage controlled oscillator according to one embodiment.

FIG. 2 depicts an example of a voltage controlled oscillator according to one 20 embodiment. Voltage controlled oscillator 200 includes an inductor-capacitor (LC) tank 202 and a cross-coupled pair of transistors 204. LC tank 202 includes an inductor 206 and capacitors 208a and 208b. Other examples of a tank circuit may be used. A current source (not shown) may be used to provide a bias current.

Cross-coupled pair of transistors 204 includes a first transistor 212a (MI) and a second transistor 212b (M2). Transistors MI and M2 may be N-channel metal oxide semiconductor field effect transistors (MOSFETs) but may also be implemented using other components, such as P-channel MOSFETs. Transistors MI and M2 each have a gate cross-coupled with the drain of the other transistor. Also, the drains of transistors MI and M2 are each coupled to LC tank 202. Cross-coupled transistor pair 204 provides a negative resistance by sourcing/sinking current into/out of LC tank 202.

Particular embodiments bias transistors MI and M2 to normally be off, but to turn on alternatingly around peaks of an oscillating signal of LC-tank 202. When transistors MI and M2 are turned on, current (energy) is injected into LC-tank 202 to keep an oscillating signal oscillating indefinitely. Transistors MI and M2 are also off when the oscillating signal changes polarity at a crossing point (e.g., a zero crossing or middle point). This results in LC-tank 202 operating in an efficient state and provides a low power VCO design.

In one embodiment, a pair of alternating current (AC) coupling capacitors 210a and 10 210b couple the gates of cross-coupled transistor pair 204 to nodes N or P. For example, AC coupling capacitor 210a couples the gate of transistor M2 to node N and AC coupling capacitor 210b couples the gate of transistor MI to node P. AC coupling capacitors 210a and 210b block a direct current (DC) component of an oscillating signal at nodes N and P. This allows a DC bias to be applied to the gates of transistors MI and M2.

A bias circuit is used to apply the DC bias voltage to bias transistors MI and M2. Different implementations of bias circuits may be used. In one example, resistors 214a and 214b are coupled to a voltage source Vbias. Resistor 214a is coupled to the gate of transistor MI and resistor 214b is coupled to the gate of transistor M2. The bias circuit biases transistors MI and M2 to be normally off and then turn on for a short period of time. That is, the voltage Vbias is 20 set to bias transistors MI and M2 to alternatingly turn on during a peak of the oscillating signal of LC-tank 202. This is accomplished by biasing transistors MI and M2 below the transistors' threshold voltage.

Figure 3A:
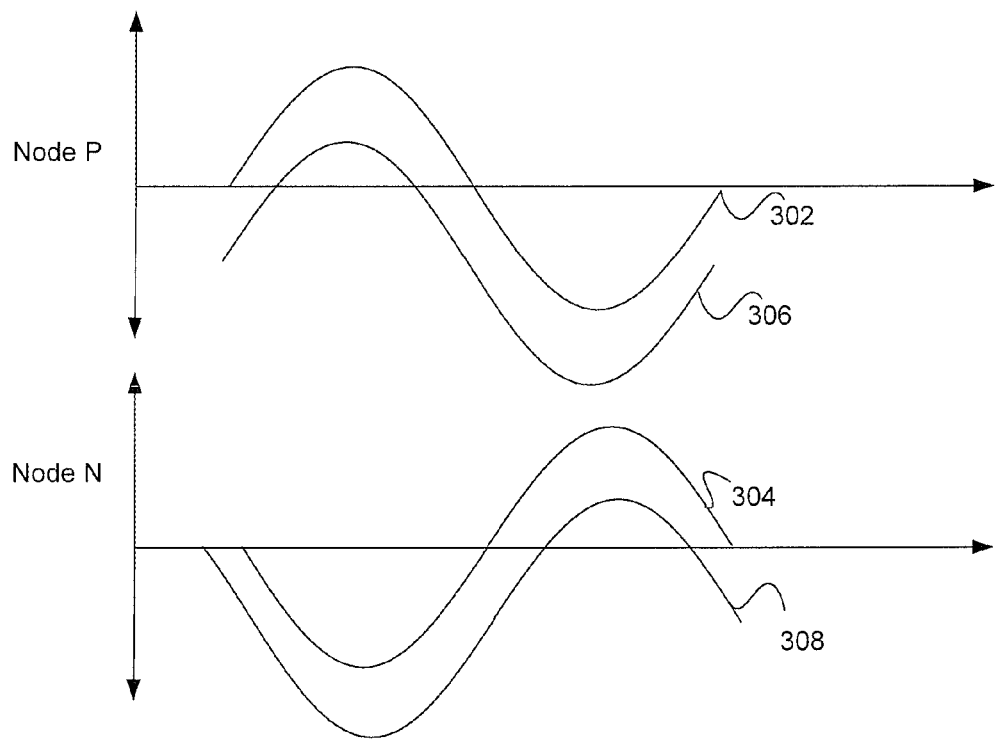
FIGS. 3a-3b depict waveforms for the operation of the VCO according to one embodiment.
Figure 3B:
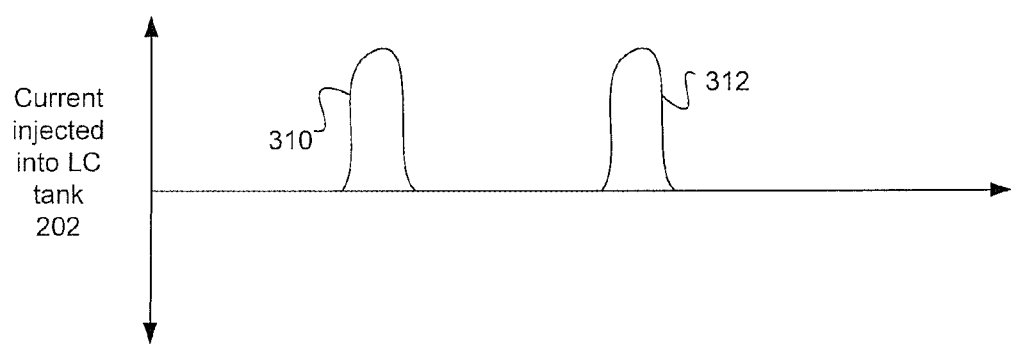

FIGS. 3a-3b depict waveforms for the operation of VCO 200 according to one embodiment. FIG. 3a shows voltage waveforms for the oscillating signal at node N and node P and voltage waveforms for signals being input into the gates of transistors MI and M2. FIG. 3b shows a waveform for the current injected into LC-tank 202.

In FIG. 3a, a voltage waveform 302 is shown for node P and a voltage waveform 304 is shown for node N. Waveforms 302 and 304 represent the oscillating signal of LC tank 202. Particular embodiments move the DC bias of waveforms 302 and 304 down to cause transistors MI and M2 to turn on momentarily during the peak of waveforms 302 and 304. For example, a waveform 306 shows the signal that is input into transistor MI and a waveform 308 shows the signal that is input into transistor M2. As shown, waveforms 306 and 308 have been moved down. This results in a shorter time that the voltage at the gates of M1 and M2 are above the threshold voltages of transistors MI and M2 to turn transistors MI and M2 on.

When waveform 306 goes above the threshold voltage of transistor MI, transistor MI turns on. This causes a spike in current, which is shown in FIG. 3b at 310. Also, when waveform 308 goes above the threshold voltage of transistor M2, this causes a spike in current, which is shown in FIG. 3b at 312. As can be seen, the spike in current occurs around the peak of 10 waveforms 302 or 304. Thus, transistors MI and M2 alternatingly turn on during the peaks of the oscillating signal. For example, during a positive peak of oscillating signal 302 at node P (or the negative peak of waveform 304 at node N), transistor MI is on and transistor M2 is off. During the zero crossing of waveforms 302 and 304, transistors MI and M2 are off. Then, during the positive peak of waveform 304 at node N (or the negative peak of waveform 302 at 15 node P), transistor M2 is on and transistor MI is off. This provides an injection of current to maintain the oscillation of the oscillating signal while limiting phase noise.

Because transistors MI and M2 may be normally biased to be off, particular embodiments may use a start-up condition to initiate VCO 200 with a large enough voltage swing such that transistors M1 and M2 turn on during the peaks of the oscillating signal. Different methods may be used to provide the start-up condition.

Figure 4:
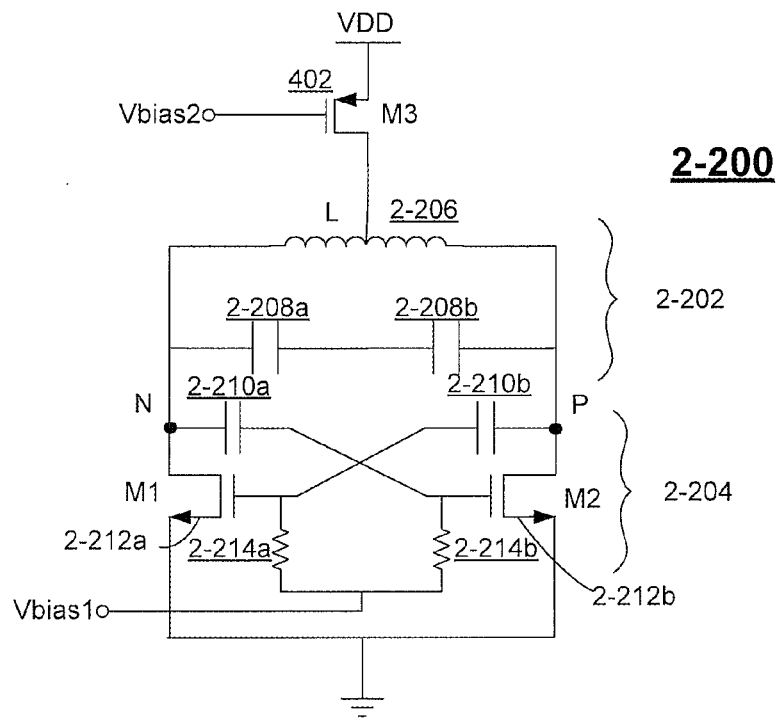
FIG. 4 depicts another example of the VCO according to one embodiment
Figure 5:
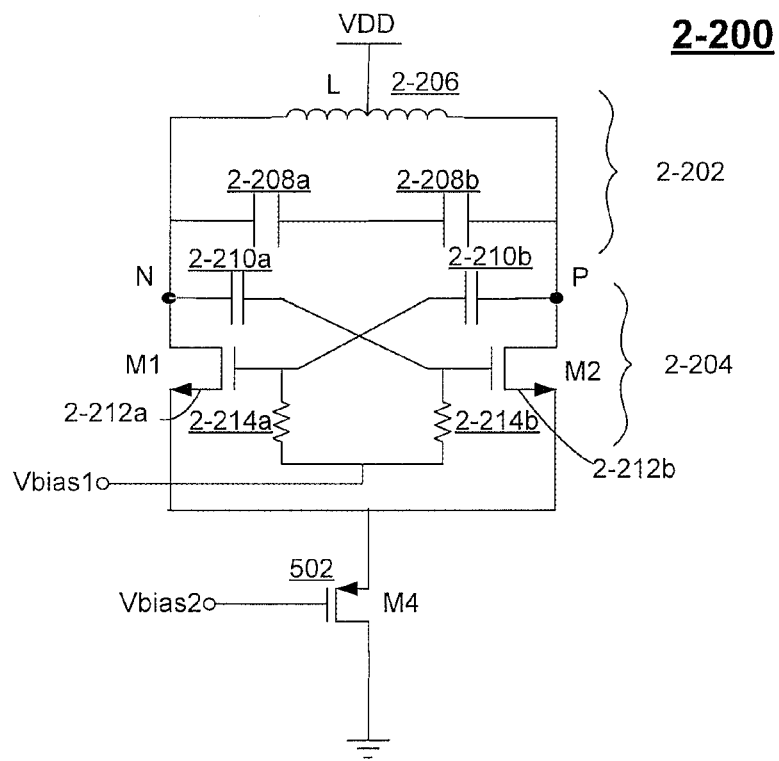
FIG. 5 depicts another example of the VCO according to one embodiment.

Different implementations of VCO 200 may be provided. For example, FIGS. 4 and 5 depict different implementations of VCO 200. Although these implementations are shown, it will be understood that other implementations may be appreciated.

FIG. 4 depicts another example of VCO 2-200 according to one embodiment. VCO 2-200 includes a transistor 402 (M3). Transistor M3 is coupled between a power supply VDD and inductor 2-206. Also, a voltage source provides a voltage Vbias2. Transistor M3 may provide a bias current. The operation of VCO 2-200 is similar to the operation of VCO 200 described in FIG. 2.

FIG. 5 depicts another example of VCO 2-200 according to one embodiment. A transistor 502 (M4) has been added to VCO 2-200. Transistor M4 is coupled to the sources of transistors MI and M2. A voltage source provides a voltage Vbias2 into the gate of transistor M4. Transistor M4 may provide an optional bias current which allows better current control during start-up operation. The operation of VCO 2-200 is similar to the operation of VCO 200 described in FIG. 2. Other implementations of VCO 2-200 may also be used.

Turning on transistors MI and M2 around the peak of oscillation periods of the oscillating signal may result in peaky current through the power supply VDD. This current has a fundamental frequency that is twice the oscillation frequency of LC-tank 202. Particular 10 embodiments may suppress the potential radiation of this energy through a packaging inductance of a device including VCO 200 by using a capacitor coupled to the center tap of inductor 206 and to the sources of transistors MI and M2.

Figure 6:
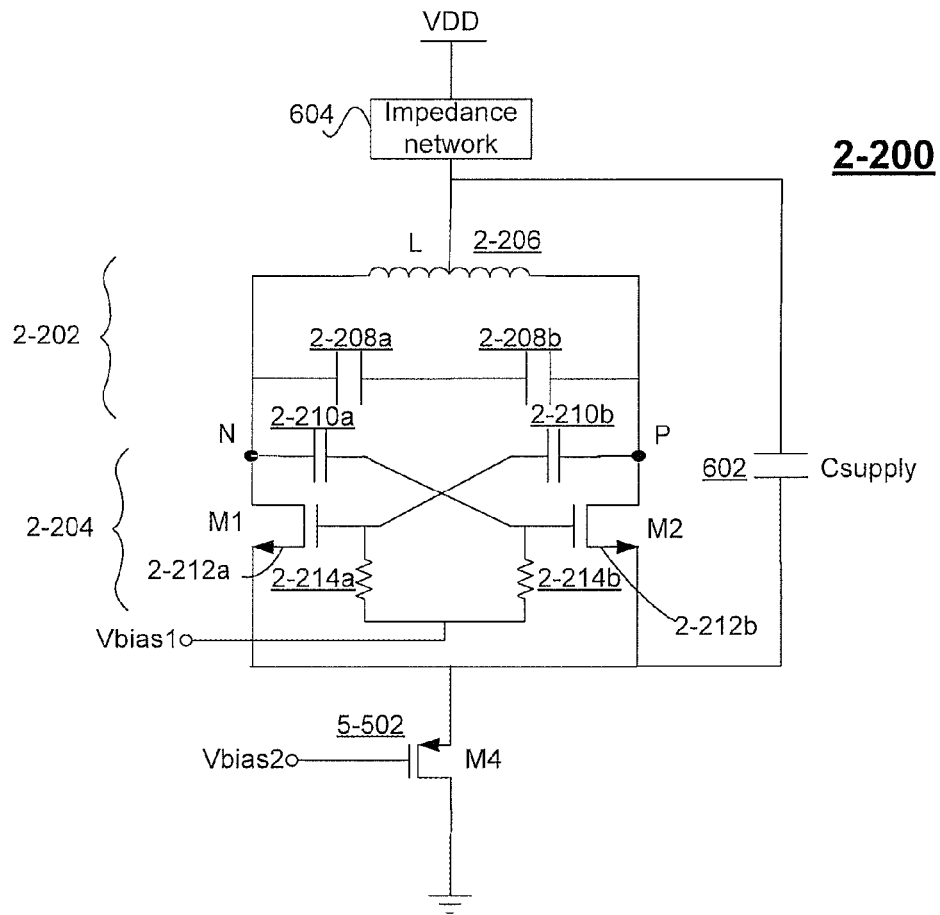
FIG. 6 depicts an example of a VCO that includes a capacitor (Csupply) according to one embodiment.

FIG. 6 depicts an example of VCO 2-200 that includes a capacitor 602 (Csupply) according to one embodiment. Capacitor 602 is coupled to inductor 2-206 at a tap point, such as 15 a center tap point to inductor 2-206. Also, capacitor 602 is coupled to the sources of transistors M1 and M2.

Capacitor 602 provides an instantaneous current that may be needed by VCO 2-200. For example, when transistors MI or M2 turn on, the current may spike as shown in FIG. 3b. It may not be possible to supply the instantaneous current using the power supply VDD. 20 Accordingly, capacitor 602 may be used to supply some of the instantaneous current that is needed. For example, when one of transistors M1 or M2 turns on, current may be supplied via the power supply VDD and also from capacitor 602.

Figure 7:
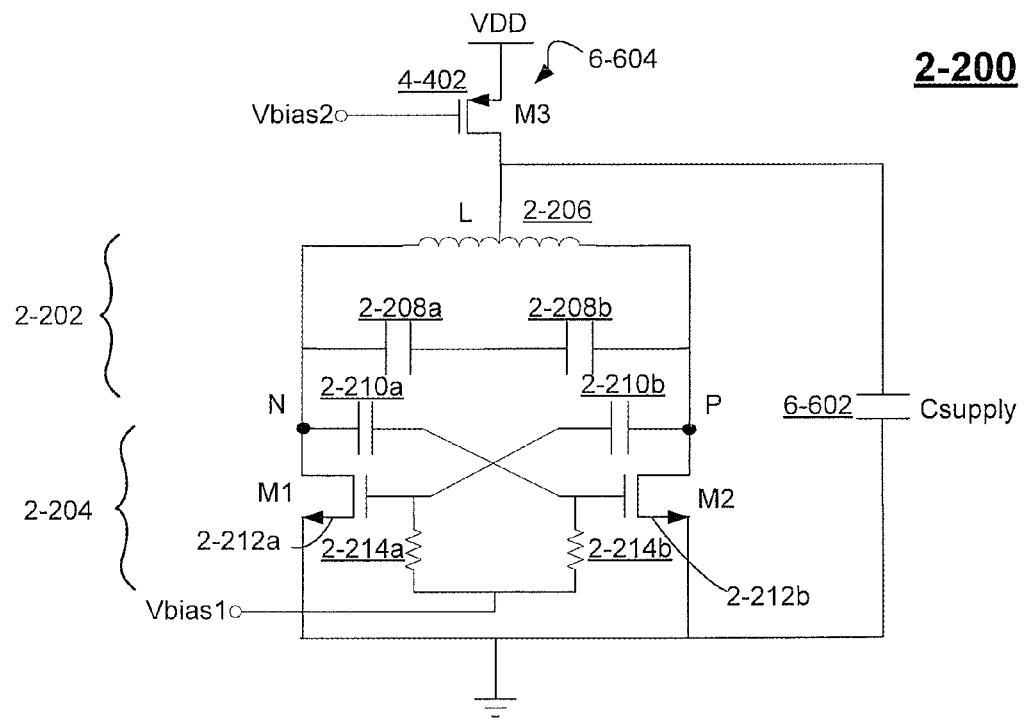
FIG. 7 depicts an example of the VCO of FIG. 6 with an example impedance network according to one embodiment.

A series impedance network 604 may also be added in between the tap to inductor 2-206 and the power supply VDD. Impedance network 602 may be used to choke off the spike in current such that it does not reach the power supply VDD. The impedance network may also be implemented differently, such as using any choke, an active voltage regulator, or an active current source. For example, FIG. 7 shows an example of impedance network 6-604 according to one embodiment. Transistor 4-402 provides an impedance between the tap to inductor 2-206 and the power supply VDD.

Figure 8:
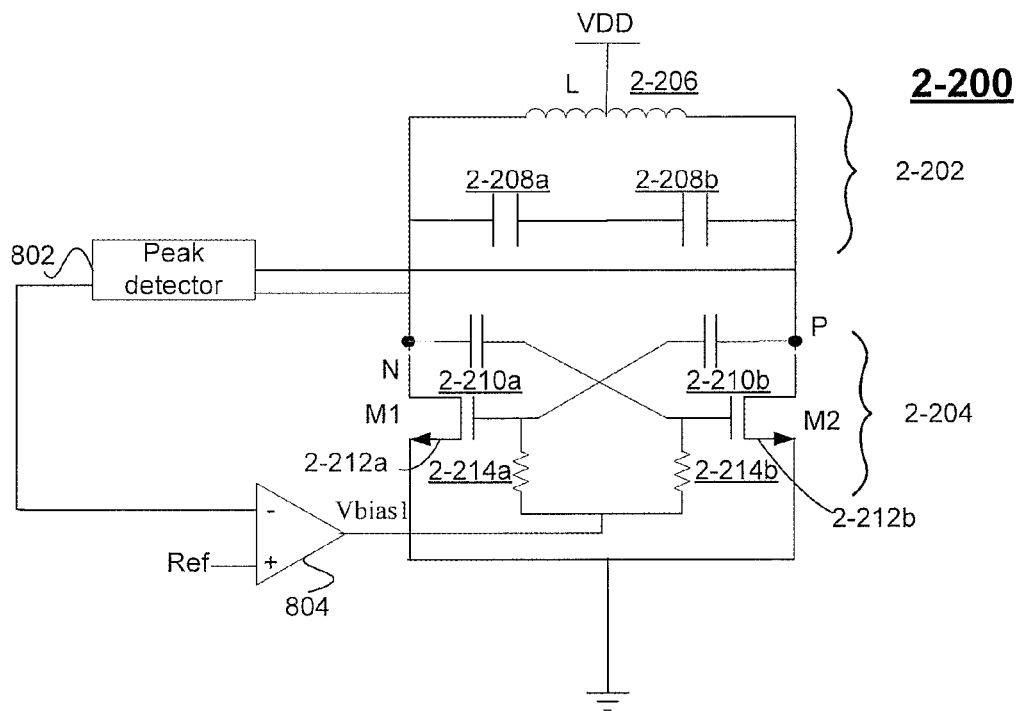
FIG. 8 depicts an example of a VCO for tracking the process and temperature variations of the die according to one embodiment.

In a real world implementation, the bias voltage for transistors MI and M2 tracks the process and temperature variations of a die including VCO 200. FIG. 8 depicts an example of VCO 2-200 that may cause transistors MI and M2 to track the processing temperature variations of the die according to one embodiment. A feedback loop is provided to adjust the DC bias voltage Vbiasl. In one embodiment, the feedback loop includes a peak detector 802 and an op amp 804. Although peak detector 802 and op amp 804 are described, other feedback loops may be used to adjust the DC bias voltage Vbiasl.

Peak detector 802 is coupled to nodes P and N. Peak detector 802 detects the peak oscillation amplitude of the oscillating signal at nodes P and N. For example, the peak 10 oscillating amplitude is determined by comparing a first peak oscillating amplitude at node P and a second peak oscillating amplitude at node N. The peak oscillating amplitude is the largest oscillating amplitude out of the first peak oscillating amplitude and the second peak oscillating amplitude.

The peak oscillation amplitude is then input into op amp 804 along with a reference. Op amp 804 may be a comparator that compares the peak oscillation amplitude with the reference and outputs a DC bias voltage Vbiasl. The DC bias voltage Vbiasl is adjusted by the feedback loop such that eventually the DC bias voltage Vbiasl settles to the reference. This allows the DC bias voltage Vbiasl to be independent of any variations due to temperature or process. Also, the amplitude of the voltage at nodes N and P is maximized for a given overall power budget.

Figure 9:
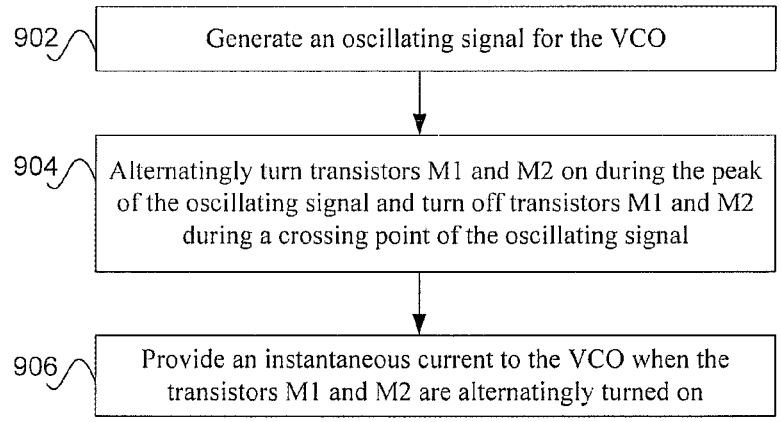
FIG. 9 depicts a simplified flowchart describing the operation of the VCO for FIGS. 6 and 7 according to one embodiment.

FIG. 9 depicts a simplified flowchart 900 describing the operation of VCO 2-200 for FIGS. 6 and 7 according to one embodiment. At 902, LC-tank 202 generates an oscillating signal for VCO 200. At 904, transistors MI and M2 are alternatingly turned on during the peak of the oscillating signal and turned off during a crossing point of the oscillating signal. A bias circuit is used to turn on transistors MI and M2 during the peak of the oscillating signal and turn off during the crossing point of the oscillating signal. At 906, an instantaneous current is provided to VCO 2-200 when the transistors MI and M2 are alternatingly turned on.

Figure 10:
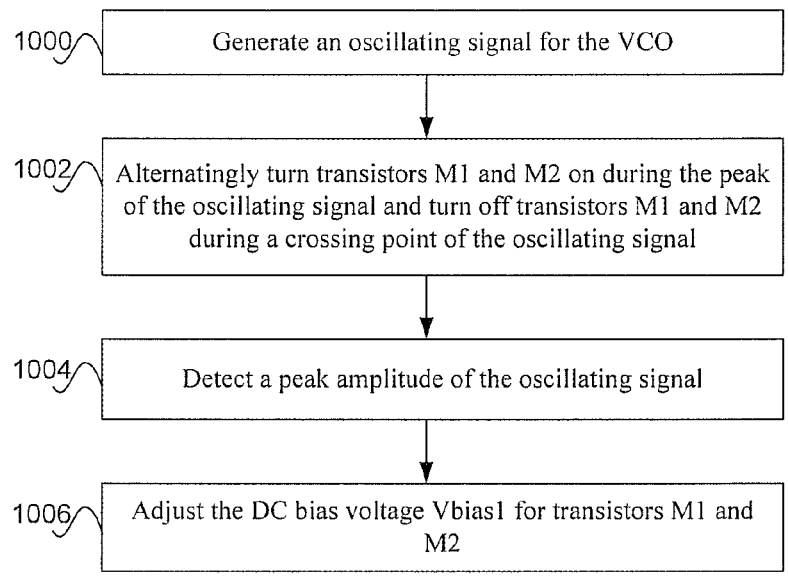
FIG. 10 depicts a simplified flowchart describing the operation of the VCO as shown in 10 FIG. 8 according to one embodiment.

FIG. 10 depicts a simplified flowchart 1000 describing the operation of VCO 2-200 as shown in FIG. 8 according to one embodiment. At 1002, LC-tank 202 generates an oscillating signal for VCO 200. At 1004, transistors MI and M2 are alternatingly turned on during the peak of the oscillating signal and turned off during a crossing point of the oscillating signal.

Figure 11:
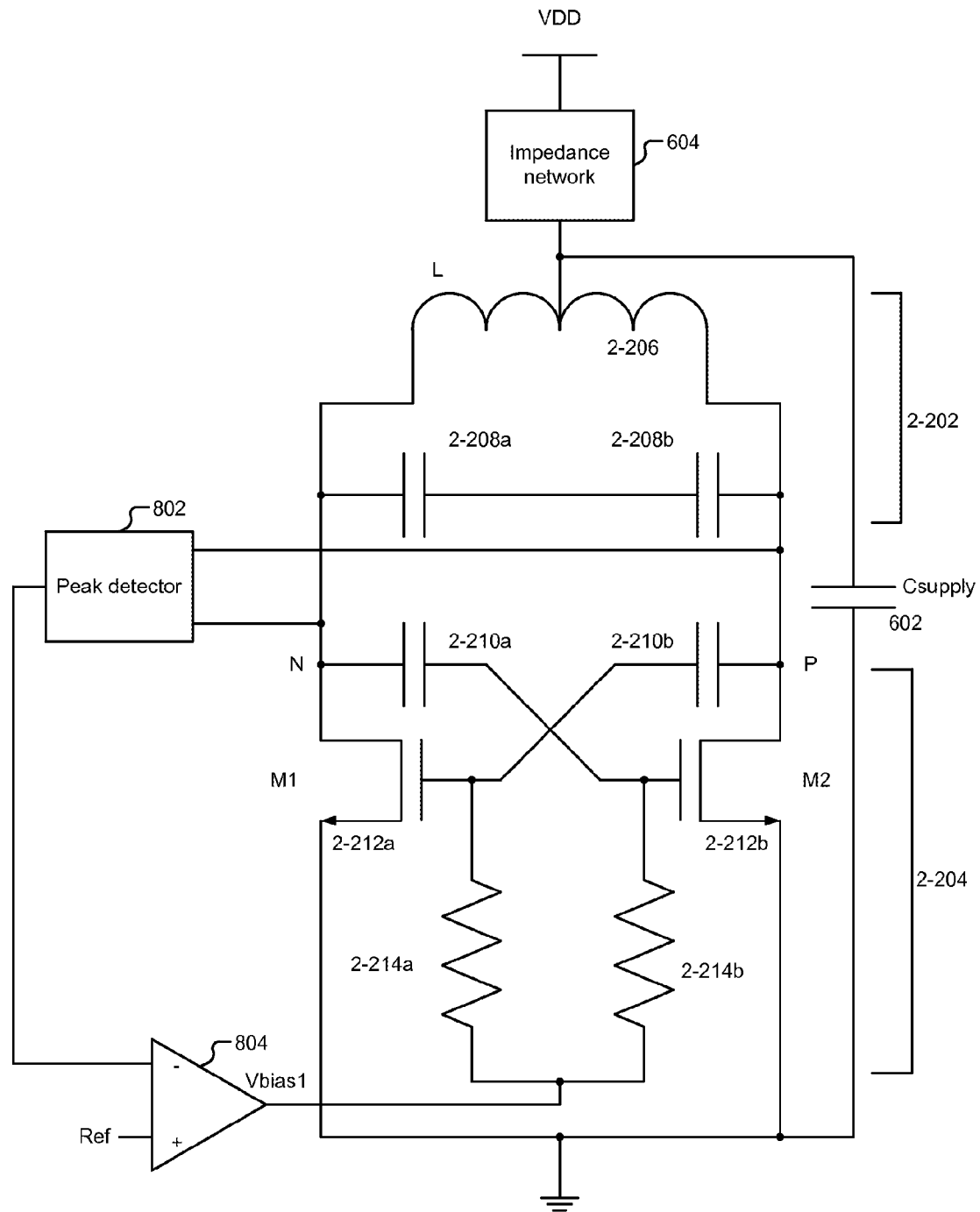
FIG. 11 depicts another example of a VCO that includes a capacitor (Csupply) according to one embodiment.

FIG. 11 depicts another example of a VCO that includes a capacitor (Csupply) according to one embodiment. The VCO includes all of the components of the VCO 2-200 shown in FIG. 8 and the impedance network 604 and the capacitor Csupply 602 show in FIG. 6.

At 1006, peak detector 802 detects a peak oscillating amplitude of the oscillating signal. For example, the peak oscillating amplitude is detected from nodes N and P. At 1008, the DC bias voltage Vbiasl is then adjusted for transistors MI and M2 based on the peak oscillating amplitude As used in the description herein and throughout the claims that follow, "a", "an", and "the" includes plural references unless the context clearly dictates otherwise. Also, as used in the description herein and throughout the claims that follow, the meaning of "in" includes "in" 10 and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A circuit comprising:
   a tank circuit configured to generate an oscillating signal;
   a pair of transistors, wherein each transistor of the pair of transistor includes
   (i) a drain terminal coupled to the tank circuit,
   (ii) a source terminal coupled the source terminal of the other transistor of the pair of transistor, and
   (iii) a gate terminal cross-coupled to the drain terminal of the other transistor via a respective capacitor;
   a bias circuit coupled to the gates of the pair of transistors, wherein the bias circuit is configured to
   (i) alternatingly turn on the pair of transistors during a plurality of peaks of the oscillating signal, and
   (ii) turn off the pair of transistors during a plurality of crossing points of the oscillating signal; and
   a capacitor having a first terminal connected to the tank circuit and a second terminal connected to the source terminals of the pair of transistors.

2. The circuit of claim 1, wherein the bias circuit is configured to bias the pair of transistors below a threshold voltage of the pair of transistors.

3. The circuit of claim 1, wherein the bias circuit comprises:
a bias voltage source; and
a resistor coupled to the gate terminal of one of the pair of transistors.

4. The circuit of claim 1, wherein the plurality of peaks of the oscillating signal comprises:
a first peak of the oscillating signal at a first node of the tank circuit; and
a second peak of the oscillating signal at a second node of the tank circuit.

5. The circuit of claim 1, further comprising a feedback circuit configured to (i) detect an amplitude of the oscillating signal, and (ii) adjust a bias voltage of the bias circuit based on the amplitude to a reference.

6. The circuit of claim 5, wherein the feedback circuit configured to adjust the bias voltage of the bias circuit to a reference.

7. The circuit of claim 5, wherein the feedback circuit configured to adjust, based on a power budget, the bias voltage of the bias circuit to maximize the amplitude of the oscillating signal.

8. The circuit of claim 5, wherein the feedback circuit comprises:
a peak detector configured to detect the amplitude of the oscillating signal; and
a comparator configured to (i) compare the amplitude to the reference, and (ii) output the adjusted bias voltage.

9. The circuit of claim 8, wherein the amplitude comprises a first amplitude, and wherein the peak detector is configured to:
detect a second amplitude of the oscillating signal at a first node of the tank circuit;
detect a third amplitude of the oscillating signal at a second node of the tank circuit; and
determine the first amplitude by comparing the second amplitude to the third amplitude.

10. A method comprising:
generating an oscillating signal using a tank circuit connected to first terminals of a pair of transistors;
biasing the pair of transistors to (i) alternatingly turn on during a plurality of peaks of the oscillating signal, and (ii) turn off during a plurality of crossing points of the oscillating signal; and
supplying current from a capacitor having a first terminal connected to the tank circuit and a second terminal connected to second terminals of the pair of transistors.

11. The method of claim 10, wherein biasing the pair of transistors comprises biasing the pair of transistors below a threshold voltage of the pair of transistors.

12. The method of claim 10, wherein the plurality of peaks of the oscillating signal comprises:
a first peak of the oscillating signal at a first node of the tank circuit; and
a second peak of the oscillating signal at a second node of the tank circuit.

13. The method of claim 10, further comprising:
detecting an amplitude of the oscillating signal; and
adjusting a bias voltage of the pair of transistors based on the amplitude.

14. The method of claim 13, wherein adjusting the bias voltage comprises adjusting the bias voltage to a reference.

15. The method of claim 13, wherein adjusting the bias voltage comprises adjusting, based on a power budget, the bias voltage to maximize the amplitude of the oscillating signal.

16. The method of claim 13, further comprising:
comparing the amplitude to a reference; and
outputting, based on the comparing, the adjusted bias voltage.

17. The method of claim 13, wherein the amplitude comprises a first amplitude, the method further comprising:
detecting a second amplitude of the oscillating signal at a first node of the tank circuit;
detecting a third amplitude of the oscillating signal at a second node of the tank circuit; and
determining the first amplitude by comparing the second amplitude to the third amplitude.

* * * * *